United States Patent
Du et al.

(10) Patent No.: US 12,237,004 B1
(45) Date of Patent: Feb. 25, 2025

(54) CONFIGURABLE, HIGH SPEED AND HIGH VOLTAGE TOLERANT OUTPUT DRIVER

(71) Applicant: Synopsys, Inc., Mountain View, CA (US)

(72) Inventors: Yamin Du, Richmond Hill (CA); Vladimir Zlatkovic, Belmont, MA (US); Alex Alexeyev, Beverly, MA (US); De Zhong Cheng, Nepean (CA)

(73) Assignee: Synopsys, Inc., Sunnyvale, CA (US)

( * ) Notice: Subject to any disclaimer, the term of this patent is extended or adjusted under 35 U.S.C. 154(b) by 174 days.

(21) Appl. No.: 17/896,996

(22) Filed: Aug. 26, 2022

Related U.S. Application Data

(60) Provisional application No. 63/237,291, filed on Aug. 26, 2021.

(51) Int. Cl.
*G11C 11/4096* (2006.01)
*H03K 3/356* (2006.01)

(52) U.S. Cl.
CPC .... *G11C 11/4096* (2013.01); *H03K 3/356113* (2013.01)

(58) Field of Classification Search
CPC .............. G11C 11/4096; H03K 3/356113
See application file for complete search history.

(56) References Cited

U.S. PATENT DOCUMENTS

| | | | | |
|---|---|---|---|---|
| 8,446,173 | B1* | 5/2013 | Faucher | H03K 19/017509 326/86 |
| 2012/0062275 | A1* | 3/2012 | Hiraki | H03K 19/017545 326/30 |
| 2021/0335406 | A1* | 10/2021 | Agrawal | G11C 29/4401 |
| 2021/0367598 | A1* | 11/2021 | Hyun | H03K 19/1733 |

* cited by examiner

*Primary Examiner* — Sultana Begum
(74) *Attorney, Agent, or Firm* — Weaver Austin Villeneuve & Sampson LLP

(57) ABSTRACT

An output driver includes a pullup driver, a pulldown driver and a resistive element. The pullup driver includes a first PMOS transistor having a source coupled to a first supply voltage and a gate receiving a first data representative of a transmitted data, and a second PMOS transistor having a source coupled to a drain of the first PMOS transistor and a gate receiving a first analog signal. The pulldown driver includes a first NMOS transistor having a source coupled to a second supply voltage and a gate receiving a second data representative of the transmitted data, and a second NMOS transistor having a source coupled to a drain of the first NMOS transistor, a drain coupled to a drain of the second PMOS transistor, and a gate receiving a second analog signal. The resistive element is coupled between the drain terminal of the second NMOS transistor and a pad.

20 Claims, 12 Drawing Sheets

CONFIGURABLE, HIGH SPEED AND HIGH VOLTAGE TOLERANT OUTPUT DRIVER

RELATED APPLICATION

The present application claims benefit under 35 USC 119 (e) of U.S. Patent Application No. 63/237,291, filed Aug. 26, 2021, the content of which is incorporated herein by reference in its entirety.

TECHNICAL FIELD

The present disclosure relates to integrated circuit (IC) design, and more particularly, to a configurable, high speed and high voltage tolerant output driver for use in IC memories.

BACKGROUND

A double data rate (DDR) synchronous dynamic random-access memory (SDRAM) can transfer data at a rate that is twice the data transfer rate of a SDRAM. The demand for higher computing power has seen a parallel increase in faster memory devices, leading to the development of subsequent versions of DDR, for example, DDR2, DDR3, and DDR4 memories. To increase the bandwidth and reduce power consumption of an SDRAM beyond those of a DDR memory, IC memories may be designed to support various versions of DDR (e.g., DDR5 or low-power DDR5).

SUMMARY

An output driver, in accordance with one embodiment of the present disclosure, includes in part, a first pullup driver, a pulldown driver and a first resistive element. The first pullup driver includes, in part, a first PMOS transistor having a source terminal coupled to a first supply voltage and a gate terminal receiving a first data representative of a transmitted data, and a second PMOS transistor having a source terminal coupled to a drain terminal of the first PMOS transistor and a gate terminal receiving a first analog signal. The pulldown driver includes, in part, a first NMOS transistor having a source terminal coupled to a second supply voltage and a gate terminal receiving a second data representative of the transmitted data, and a second NMOS transistor having a source terminal coupled to a drain terminal of the first NMOS transistor, a drain terminal coupled to a drain terminal of the second PMOS transistor, and a gate terminal receiving a second analog signal. The first resistive element is coupled between the drain terminal of the second NMOS transistor and a pad of the output driver.

In one embodiment, the output driver further includes, in part, a second pullup driver. The second pullup driver includes, in part, a third NMOS transistor having a drain terminal coupled to the first supply voltage and a gate terminal receiving a third data representative of the transmitted data, a fourth NMOS transistor having a drain terminal coupled to a source terminal of the third NMOS transistor and a gate terminal receiving a first control signal, a third PMOS transistor having a drain terminal coupled to a source terminal of the fourth NMOS transistor and a gate terminal receiving an inverse of the third data, and a fourth PMOS transistor having a source terminal coupled to the first supply voltage and a gate terminal receiving an inverse of the first control signal.

In one embodiment, the output driver further includes, in part, a second resistive element disposed between the pad and the source terminal of the fourth NMOS transistor. In one embodiment, the output driver further includes, in part, a control circuit configured to cause the pad to be coupled to the first supply voltage via a first external resistor in response to a first state of a mode select signal. The control circuit is further configured to cause the pad to be coupled to the second supply voltage via a second external resistor in response to a second state of the mode select signal.

In one embodiment, the output driver is disposed in a memory that includes, in part, a first digital-to-analog converter (DAC) generating the first analog signal, and a second DAC generating the second analog signal. In one embodiment, the output driver further includes, in part, a level shifter configured to cause the first data to vary between the first supply voltage and a third voltage, wherein the third voltage is smaller than the first supply voltage and greater than the second supply voltage.

In one embodiment, the second supply voltage is a ground voltage. In one embodiment, the output driver is disposed in a memory that includes a core operating using a fourth supply voltage that is smaller than the first supply voltage. In one embodiment, the third voltage is defined by a difference between the first and fourth voltages. In one embodiment, the mode select signal is placed in the first state when the first supply voltage is greater than the fourth supply voltage. In such embodiments, the mode select signal is placed in the second state when the first supply voltage is smaller than the fourth supply voltage. In one embodiment, the first and second analog signals cause an impedance associated with the pad when the transmitted data is a logic high to be substantially the same as when the transmitted data is a logic low.

In accordance with one embodiment of the present disclosure, a non-transitory computer readable medium includes stored instructions, which when executed by a processor, cause the processor to generate data representative of an output driver. The output driver includes in part, a first pullup driver, a pulldown driver and a first resistive element. The first pullup driver includes, in part, a first PMOS transistor having a source terminal coupled to a first supply voltage and a gate terminal receiving a first data representative of a transmitted data, and a second PMOS transistor having a source terminal coupled to a drain terminal of the first PMOS transistor and a gate terminal receiving a first analog signal. The pulldown driver includes, in part, a first NMOS transistor having a source terminal coupled to a second supply voltage and a gate terminal receiving a second data representative of the transmitted data, and a second NMOS transistor having a source terminal coupled to a drain terminal of the first NMOS transistor, a drain terminal coupled to a drain terminal of the second PMOS transistor, and a gate terminal receiving a second analog signal. The first resistive element is coupled between the drain terminal of the second NMOS transistor and a pad of the output driver.

A method of driving an output pad, in accordance with one embodiment of the present disclosure, includes, in part, pulling up a voltage at the pad via a first pullup driver, and pulling down the voltage at the pad via a pulldown driver. The pullup driver includes, in part, a first PMOS transistor having a source terminal coupled to a first supply voltage and a gate terminal receiving a first data representative of a transmitted data; and a second PMOS transistor having a source terminal coupled to a drain terminal of the first PMOS transistor and a gate terminal receiving a first analog signal. The pulldown driver includes, in part, a first NMOS transistor having a source terminal coupled to a second supply voltage and a gate terminal receiving a second data representative of the transmitted data; and a second NMOS transistor having a source terminal coupled to a drain terminal of the first NMOS transistor, a drain terminal coupled to a drain terminal of the second PMOS transistor, and a gate terminal receiving a second analog signal. The method further includes, in part, passing a current from a first resistive element coupled between the drain terminal of the second NMOS transistor and a pad of the output driver, and causing an impedance associated with the pad when the transmitted data is a logic high to be substantially the same as when the transmitted data is a logic low.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

An IC memory often includes an output driver that transfers the data stored in the memory to external devices. A double data rate 5 (DDR5) memory includes an output driver that supports both a standard mode of operation as well as a low power mode of operation.

A DDR5 memory output driver (alternatively referred to herein as a memory interface) includes, in part, a stack of three n-type metal oxide semiconductor (NMOS) transistors and a stack of three p-type metal oxide semiconductor (PMOS) transistors. One of the transistors in each such stack receives a thermometer code to control the output impedance of the output driver. The NMOS and PMOS transistors in each stack are relatively large resulting in a sizeable output impedance. The thermometer code further results in routing congestion. For example, 72 routing signals would be required if the thermometer code is an 8-bit code. A memory output driver, in accordance with embodiments of the present disclosure, among other advantages described in detail below, has a reduced output capacitance, is compact, and advantageously dispenses with the need for a thermometer code to control the output impedance. The following description of the present disclosure is provided with reference to a DDR5 memory. It is understood, however, that embodiments of the present disclosure equally apply to any other memory, DDR5 or otherwise.

Figure 1:
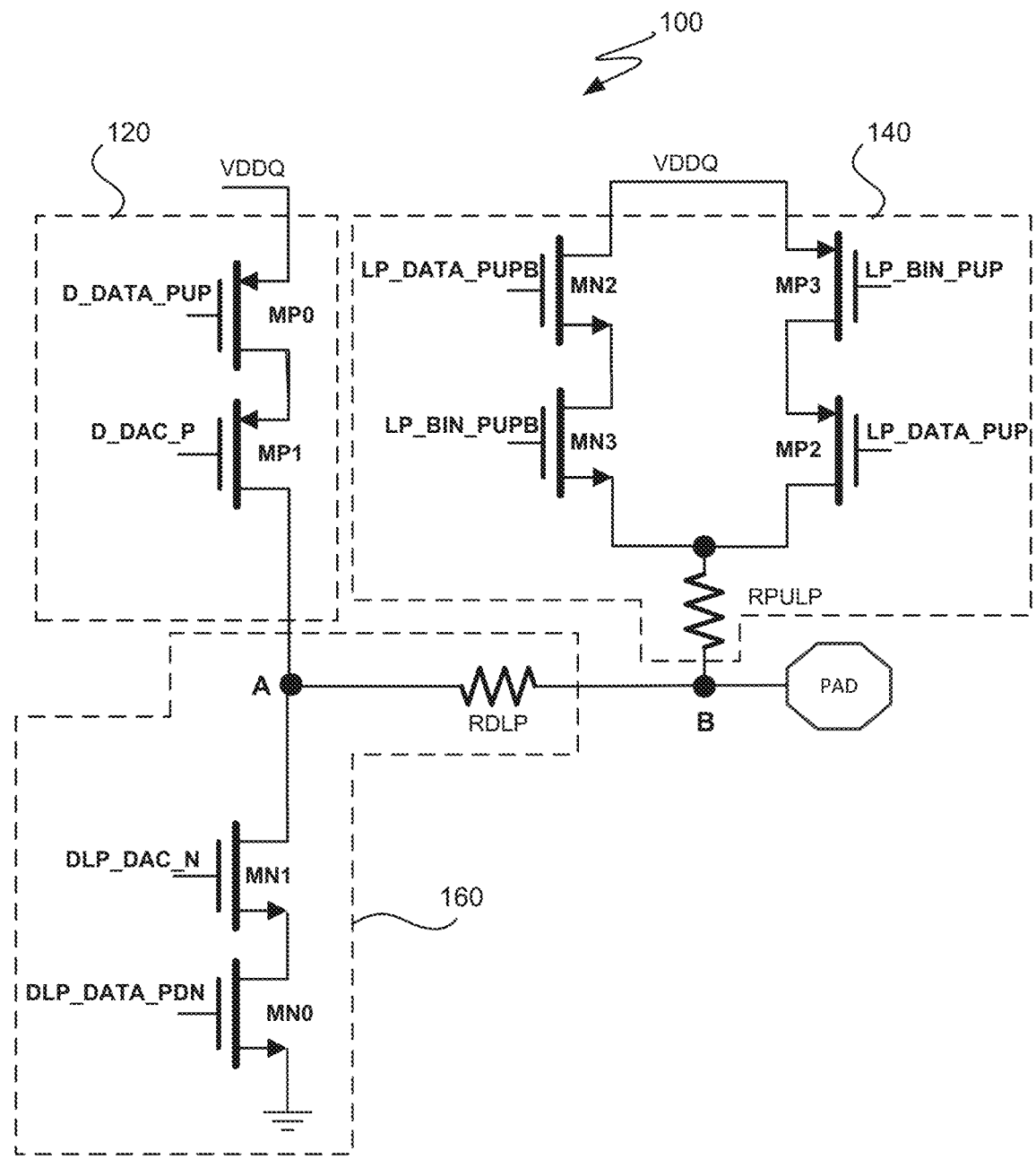
FIG. 1 is a schematic diagram of an output driver, in accordance with one embodiment of the present disclosure.

FIG. 1 is a transistor schematic diagram of an output driver 100, in accordance with one embodiment of the present disclosure. PMOS transistors MP0 and MP1 form the high-voltage pull-up driver 120 of output driver 100. NMOS transistors MN2 and MN3 together with PMOS transistors MP2 and MP3 and resistor RPULP form the low-voltage pull-up driver 140 of output driver 100. Transistors MN0 and MN1 together with resistor RDLP disposed between the output driver pad (node B) and the drain terminals of transistors MP1 and MN1, i.e., node A, form the pull-down driver 160 of output driver 100.

In the following description, VDDQ refers to the power supply used to supply voltage to the transistors in the output driver, VDD refers to the power supply used to supply voltage to the memory core transistors. High voltage (HV) operation refers to the supply voltage VDDQ>Vcore_max, and low voltage (LV) operation refers to the supply voltage VDDQ<=Vcore_max & VDD<=Vcore_max, where Vcore_max is the maximum allowable VDD for the core transistors.

Figure 2:
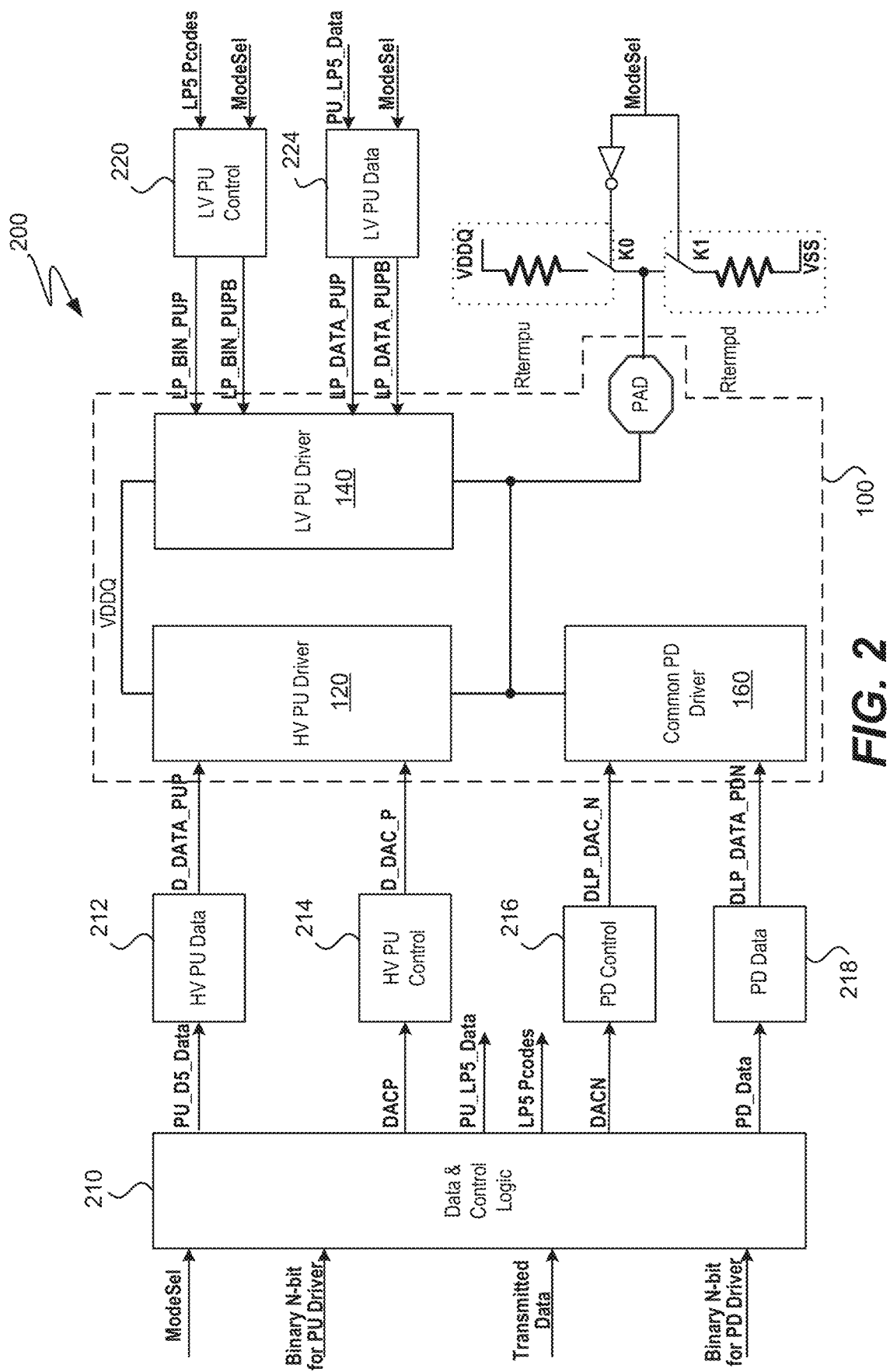
FIG. 2 shows a number of data and control blocks supplying data and control signals to an output driver, in accordance with one embodiment of the present disclosure.

When operating in a power-terminated high-voltage mode of operation, the pad gets terminated to supply voltage VDDQ via a first external resistor (e.g., present on a printed circuit board), as shown in FIG. 2 and described further below, thereby turning off low-voltage pull-up driver 140. Referring to FIG. 1, signal D_DATA_PUP applied to the gate of transistor MP0, and signal DLP_DATA_PDN applied to the gate of transistor MN0, carry the data during the high-voltage mode of operation. Signal D_DATA_PUP and DLP_DATA_PDN are in-phase. Therefore, both are either at a high logic level (alternatively referred herein as high) or at a low logic level (alternatively referred herein as low). Therefore, when signals D_DATA_PUP and DLP_DATA_PDN are both high, transistor MN0 is turned on and transistor MP0 is turned off to drive the output pad to a low voltage. The pad voltage is set by the voltage divider that includes the impedances of resistor Rtermpu and pull-down driver 160. Similarly, when signals D_DATA- _PUP and DLP_DATA_PDN are both low, transistor MN0 is turned off and transistor MP0 is turned on to drive the pad to VDDQ.

Data signal DLP_DATA_PDN is adapted to vary between voltage VDD, which is the supply voltage to the memory core (not shown), and ground voltage VSS. Data signal D_DATA_PUP is adapted to vary between voltage VDDQ, which is the supply voltage to the output driver 100, and an intermediate voltage VSH. Voltage VSH, which is set to (VDDQ-VDD) is described further below. In one embodiment, VDDQ is 1.1 volts, VDD is 0.75 volt, and VSH is 0.35 volt. Voltage VSH is an intermediate voltage having a value defined by (VDDQ-VDD) if VDDQ is greater than the maximum allowed voltage (Vcore_max) for the core transistors. Voltage VSH is set to zero if VDDQ is smaller than the maximum allowed voltage for the core transistors. Voltage VSH may be generated by a low dropout regulator (LDO) or an external power supply.

Signal D_DAC_P is an analog signal generated by a first digital-to-analog (DAC) converter, and signal DLP_DAC_N is an analog signal generated by a second digital-to-analog converter, described further below. Signal D_DAC_P is adapted to vary between VDDQ and VDDQ-VSH, and signal DLP_DAC_N is adapted to vary between VSH and VDD to control the impedance of MP1 and MN1 respectively. The DACs are calibrated, during a calibration mode, such that the impedance seen at the pad when transistor MP0 is turned on to pull up the voltage of the pad, has the same value as when transistor MN0 is turned on to pull down the voltage of the pad. In other words, the impedance at the pad is substantially the same during the pull-up and pull-down of the pad. Therefore, the pad voltage has the same slew rate during both the pull-up and pull-down operations.

When operating in a ground-terminate low-voltage mode of operation, the pad gets terminated to the ground voltage via a second external resistor, as shown in FIG. 2 and described further below. During this mode, signal D_DATA_PUP is set to high voltage, thus turning off the pull-up driver 120. Therefore, during the low-voltage mode of operation a path exists between the low-voltage pull-up driver 140 and pull-down driver 160 and the second external resistor. Signals LP_BIN_PUPB and LP_BIN_PUB are binary code and calibrated to make the impedance of low-voltage pull-up driver 140 the same as impedance of pull-down driver 160.

The data during the low-voltage mode of operation is carried by signal LP_DATA_PUP applied to the gate of transistor MP2 and its complementary signal LP_DATA_PUPB applied to the gate of transistor MN2, as well as signal DLP_DTAT_PDN applied to the gate of transistor MN0. To drive the pad to a high voltage, signals LP_DATA_PUP and LP_DATA_PUPB are respectively set to low and high voltages to turn on transistors MN2 and MP2, and signal DLP_DATA_PDN is set to a low voltage to turn off transistor MN0. The pad voltage is therefore set by the voltage divider that includes the impedances of resistor Rtermpd and pull-up driver 140. To drive the pad to a low voltage, signals LP_DATA_PUP and LP_DATA_PUPB are respectively set to high and low voltages to turn off transistors MN2 and MP2, and signal DLP_DATA_PDN is set to high voltage to turn on transistor MN0, thereby setting causing the pad voltage to be at VSS.

Figure 3:
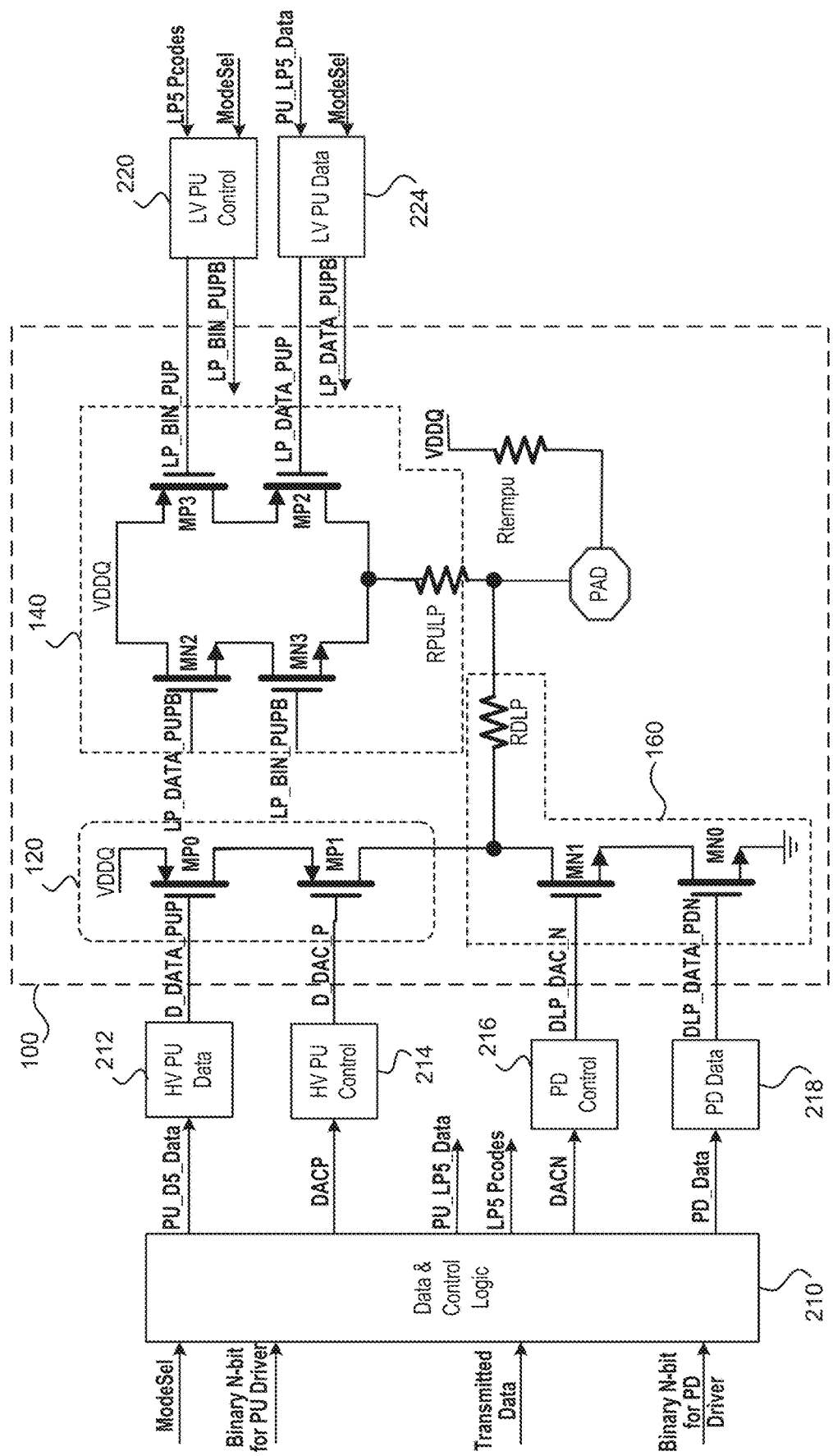
FIG. 3 is a schematic diagram of the output driver shown in FIG. 2 when operating in a power-terminated mode, in accordance with one embodiment of the present disclosure.

FIG. 2 shows the control and data blocks generating the control and data signals received by the output driver 100. FIG. 3 is similar to FIG. 2 except that in FIG. 3, the transistor connections in high voltage pull-up driver 120, low voltage pull-up driver 140 and common pull-down driver 160 are also shown. Furthermore, switch K0 of FIG. 2 is assumed to be in a closed position thereby connecting the pad to VDDQ via resistor Rtermpu, as shown in FIG. 3.

High voltage (HV) pull-up (PU) data block 212 (HV PU Data) generates signal D_DATA_PUP that is applied to HV PU Driver 120 in response to signal PU_D5_Data generated by data and control logic 210. HV PU control block 214 and Pull-Down (PD) control block 216 generate the DAC control signals D_DAC_P and DLP_DAC_N in response to N-bit codes DACP and DACN generated by data and control logic 210. PD Data block 218 generates signal DLP_DATA_PDN in response to signal PD_Data generated by data and control logic 210.

Data and control logic block 210 also generates signals PU_LP5_Data and LP5_Pcodes. Signal ModeSel selects between the HV and low voltage (LV) mode of operations. Signal ModeSel is set by an external device (not shown), such as a microcontroller, accessing the memory. LV PU control block 220 generates signals LP_BIN_PUP and LP_BIN_PUPB in response to signals LP5_Pcodes and ModeSel, and LV PU Data block 224 generates signals LP_DATA_PUP and LP_DATA_PUPB in response to signals PU_LP5_data and ModeSel. Data and control block 210, LV PU control block 220, and LV PU data block 224 receive supply voltage VDD.

FIG. 3 shows output driver 100 of FIGS. 1 and 2 when the output driver is selected to be in a HV power-terminated mode of operation by setting signal ModeSel to 0. Because signal ModeSel is set to 0, the pad is terminated to voltage VDDQ via resistor Rtermpu, as described above with reference to FIG. 2. During this mode, HV PU driver 120 and PD driver 160 are enabled, and LV PU driver 140 is disabled. The pad voltage may vary between the low voltage, namely Volpad, defined by (Rpd*VDDQ)/(Rtermpu+Rpd), and the high voltage, namely Vohpad, of VDDQ.

As shown and described above, signal D_DATA_PUP is applied to HV PU driver 110 and is adapted to vary between VDDQ and VSH. Signal D_DAC_P is an analog signal adapted to adjust the impedance of transistor MP1 and to provide protection against over-voltages, described further below. Signal D_DAC_P may vary from VSH to VDDQ-VSH.

Signal DLP_DAC_N is an analog signal adapted to adjust the impedance of transistor MN1, and to provide protection against over-voltage. Signal DLP_DAC_N may vary from VSH to VDD. Signal DLP_DATA_PDN is applied to PD driver 160, which is common to both LV PU drier 120 and LV PU Driver 140, and is adapted to vary between 0 and VDD. The gate terminals of transistors MN2 and MN3 of LV PU driver 140 MN2 are biased at VSH.

When the pad voltage is at Volpad, which is greater than or equal to VSH, the gate-to-source voltage of transistor MN3 is less than or nearly zero, thereby causing transistor MN3 to be off. When the pad voltage is at Vohpad (i.e., VDDQ) transistor MN3 is also off. Signal LP_BIN_PUP is biased at VDDQ, thereby turning off transistor MP3. Signal LP_DATA_PUP is biased at VSH to protect transistor MP2 against over-voltages.

Figure 4:
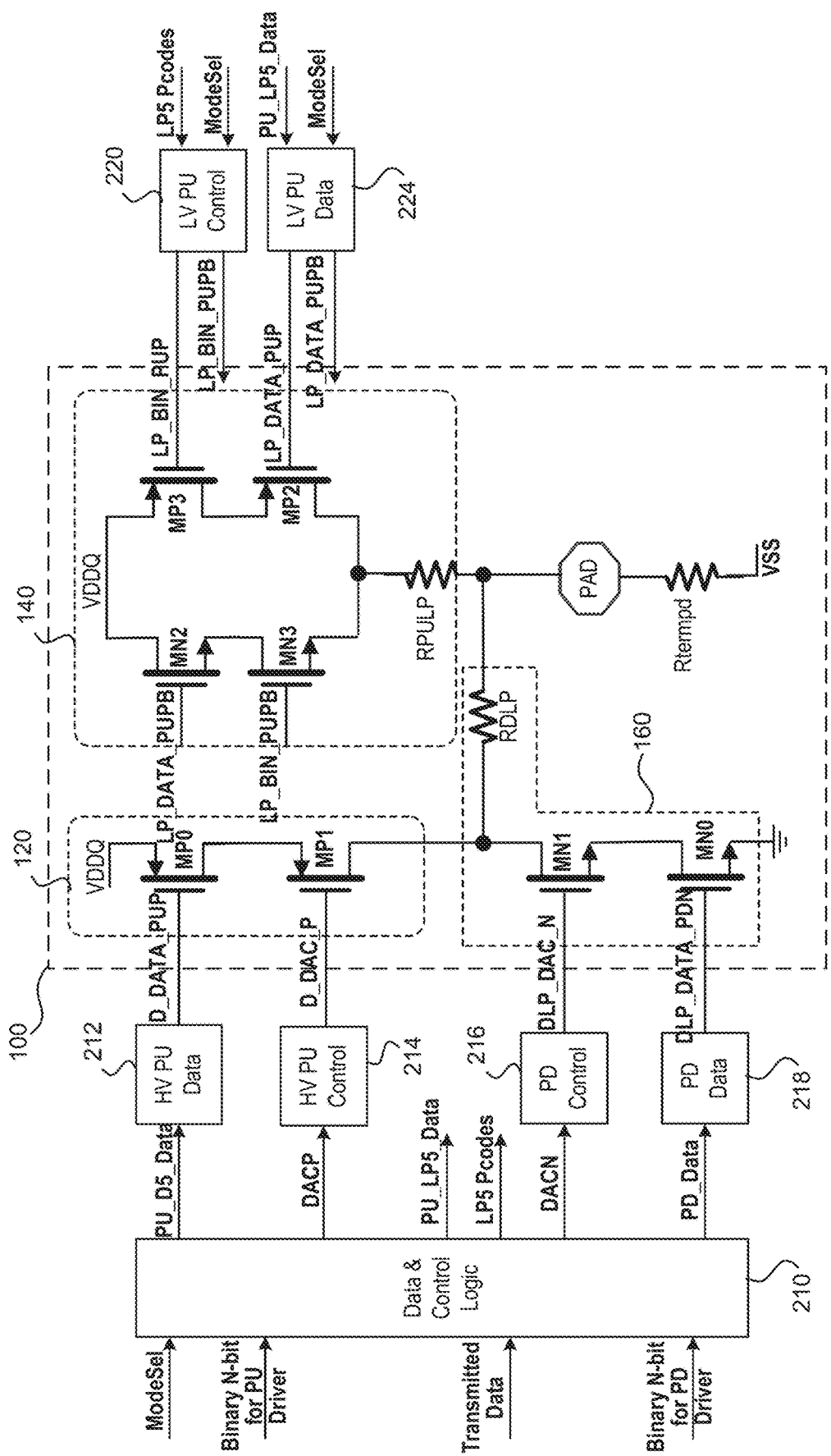
FIG. 4 is a schematic diagram of the output driver of FIG. 2 when operating in a ground-terminated mode, in accordance with one embodiment of the present disclosure.

FIG. 4 shows output driver 100 of FIGS. 1 and 2 when the output driver is selected to be in a LV ground-terminated mode of operation by setting signal ModeSel to 1. Because signal ModeSel is set to 1, the pad is terminated to voltage VSS via resistor Rtermpd, as described above with reference to FIG. 2. During this mode, VSH is shorted to the ground terminal and supply voltage VDDQ (which may have a value of e.g., 0.5V or 0.3V) is smaller than VDD. Accordingly, HV PU driver 120 is disabled and LV PU driver 140 is enabled.

During the LV ground-terminated mode of operation, the voltage at the pad can reach an upper value, namely Vohpad, of (Rtermpd*VDDQ)/(Rtermpd+Rpu), where Rpu is the impedance of LV PU driver 140. Signal D_DATA_PUP is biased at VDDQ thus turning off transistor MP0. Signal D_DAC_P is set to zero to save power. Analog signal DLP_DAC_N, applied to the gate of transistor MN1, has a value ranging from 0 to VDD. Signal DLP_DATA_PDN, which is representative of the transmitted data and is applied to the gate of transistor MN0, has a value ranging from 0 to VDD.

Signals LP_BIN_PUPB and LP_BIN_PUP, applied respectively to the gate terminals of transistors MN3 and MP3, are complementary output signals of LV PU control block 220 that receives input signals ModeSel and of LP5_Pcodes. Signals LP_BIN_PUPB and LP_BIN_PUP are used to adjust the impedances of transistors MP3 and MN3, respectively. If signal LP_BIN_PUPB is at VDD and signal LP_BIN_PUP is at 0 volt, both transistor MN3 and MP3 are on. Conversely, if signal LP_BIN_PUPB is at 0 and signal LP_BIN_PUP is at VDD, both transistor MN3 and MP3 are off. Signals LP_DATA_PUPB & LP_DATA_PUP, applied respectively to the gate terminals of transistors MN2 and MP2, are complementary output signals of LV PU data block 224 that receives input signals ModeSel and of PU_LP5_Data. If signal LP_DATA_PUPB is at VDD, and signal LP_DATA_PUP is at 0 volt, both transistors MN2 and MP2 are on. Conversely, if signal LP_DATA_PUPB is at 0 volts, and signal LP_DATA_PUP is at VDD, both transistors MN2 and MP2 are off.

Figure 5:
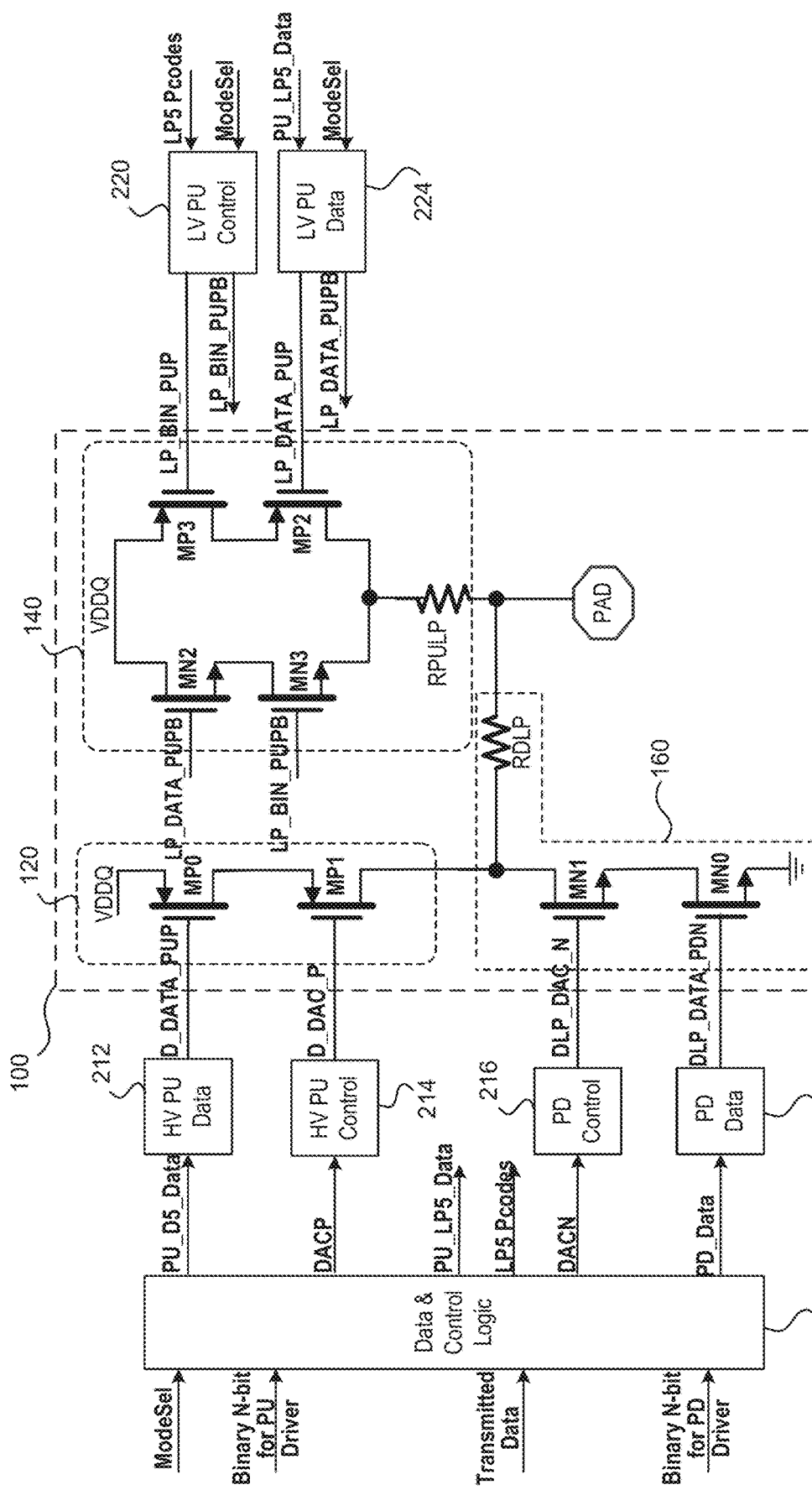
FIG. 5 is a schematic diagram of the output driver of FIG. 2 when operating in a rail-to-rail mode, in accordance with one embodiment of the present disclosure.

FIG. 5 shows output driver 100 of FIGS. 1-4 when the output driver's pad is not terminated to an external resistor. Therefore, the voltage at the pad may vary from rail to rail when mode select signal ModeSel is set to 0. For example, if VDDQ is set to 1.2V and signal ModeSel is 0, the voltage at the pad may vary from 0 to 1.2 volts.

The output driver shown in FIG. 5 operates in the same manner as the output drivers shown in FIGS. 3 and 4 except that in the output driver shown in FIG. 5, signal LP_BIN_PUPB is adapted to track the voltage of the pad to prevent leakage current flow from VDDQ to the pad through transistor MN3. When the voltage at the pad is zero, if the voltage at LP_BIN_PUPB is otherwise kept at VSH, then transistor MN3 would be on thus causing a leakage current to flow from VDDQ to the pad. To prevent this leakage current, when the voltage at the pad is zero, the voltage at LP_BIN_PUPB is also set to zero. When the voltage at the pad is VDDQ, if the voltage at LP_BIN_PUPB is otherwise kept at zero, transistor MN3 would receive a relatively large gate-to-source voltage. To prevent the problem associated with the large gate-to-source voltage at transistor MN3, when the voltage at the pad is at VDDQ, the voltage at LP_BIN_PUPB is set to VSH.

During the low-voltage mode of operation when signal ModeSel is set to 1, output driver 140 drives the pad rail-to-rail from VDDQ to the ground potential. During this mode, VDDQ may have a value between 0.3 volts and 0.5 volts. Moreover, during this mode, signal VSH is shorted to the ground.

Figure 6A:
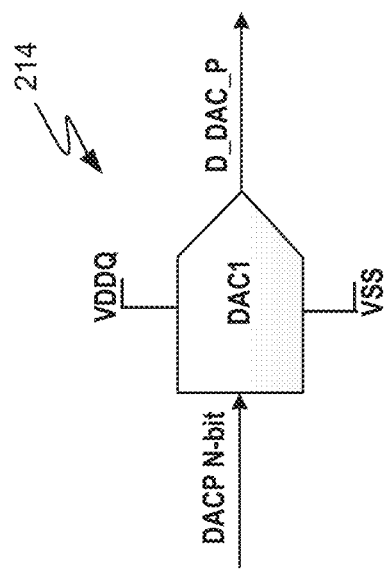
FIGS. 6A and 6B are simplified blocks diagrams of DACs supplying signals to the output driver shown in FIGS. 1-5, in accordance with one embodiment of the present disclosure.
Figure 6B:
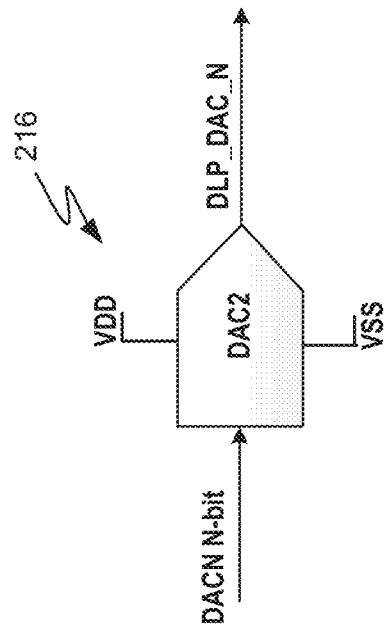

FIGS. 6A and 6B are block diagrams of HV PU control 214 and PD control 216 shown in FIGS. 2-5, in accordance with one embodiment of the present disclosure. Both HV PU control 214 and PD control 216 are shown as being DACs. Analog signal D_DAC_P is generated by DAC 214 that receives supply voltage VDDQ. Analog signal DLP_DAC_N is generated by DAC 216 that receives supply voltage VDD. DACs 214 and 216 may be any type of DAC, such as an R-2R ladder DAC. DAC 214's resolution is defined by the N bits of input signal DACP, and DAC 216's resolution is defined by the N bits of signal DACP.

In HV operations, the output range of DAC 214 is between VSH and VDDQ-VSH, and its corresponding code range is between $$\frac{VSH}{VDDQ} x (2^N - 1) \text{ and } \frac{VDDQ - VSH}{VDDQ} x (2^N - 1).$$

In HV operations, the output range of DAC 216 is between VSH and VDD, and its corresponding code range is between $$\frac{VSH}{VDD} x (2^N - 1) \text{ and } (2^N - 1).$$

In LV operations, DAC 214 is turned off by setting the N bits of its input signal DACP to 0 so as to save power. In LV operations, DAC 216's output range may vary from zero to VDD, and its corresponding code range is between 0 to $(2^N-1)$.

Figure 7A:
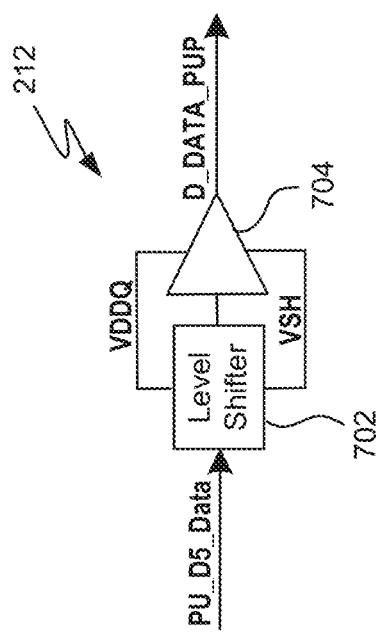
FIGS. 7A and 7B show a number of blocks supplying signals to the output driver shown in FIGS. 1-5, in accordance with one embodiment of the present disclosure.
Figure 7B:
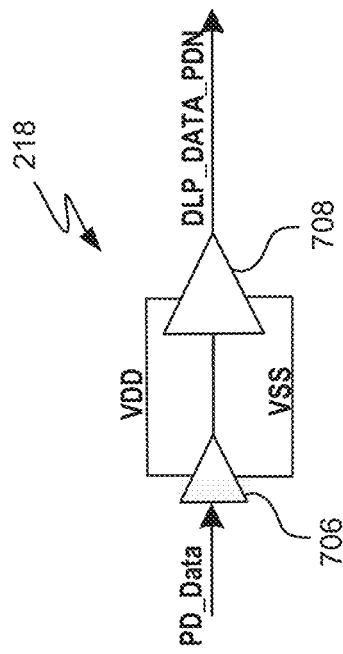

FIGS. 7A and 7B are block diagrams of HV PU Data 212 and PD Data 218 shown in FIGS. 2-5, in accordance with one embodiment of the present disclosure. High speed data signal PU_D5_Data that varies between VDD and VSS is level shifted by level shifter 702 so as to vary between VDDQ and VSH. The output of level shifter 702 is buffered by buffer 704 to generate signal D_DATA_PUP applied to transistor MP0 of pull-up driver 120. Therefore, signal D_DATA_PUP toggles between VDDQ and VSH.

High speed data signal PD_Data that varies between VDD and VSS is buffered by buffers 706 and 708 to generate signal DLP_DATA_PDN applied to transistor MN0 of pull-down driver 160. As described above, pull-down driver 160 is common to both HV and LV operations and remains on during both operations.

Figure 8:
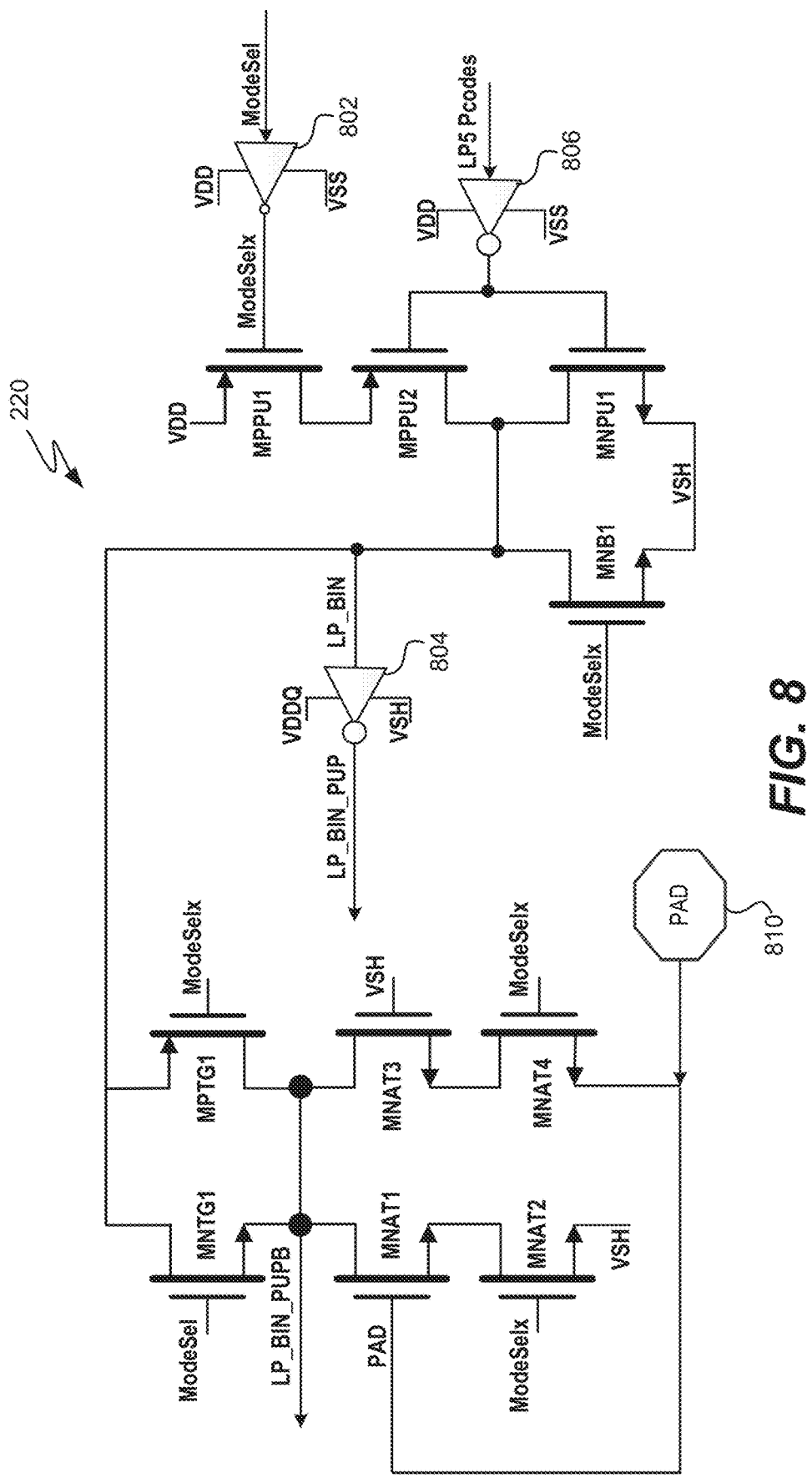
FIG. 8 is a transistor schematic diagrams of a control circuit supplying signals to the output driver shown in FIGS. 1-5, in accordance with one embodiment of the present disclosure.

FIG. 8 is a transistor schematic diagrams of LV PU Control 220 shown in FIGS. 2-5, in accordance with one embodiment of the present disclosure. Referring to FIGS. 2-5 and 8 concurrently, as described above, when output driver is selected to operate in the HV mode, either when the pad is terminated to VDDQ via an external resistor as shown in FIG. 3 (alternatively referred to herein as HV power-terminated mode) or when the pad is not terminated to an external resistor and operates in a HV rail-to-rail mode as shown in FIG. 5), because signal ModeSel is set to zero, transistors MP3 and MN3 are off, and therefore LP PU driver 140 is disabled. When the output driver is selected to operate in the LV mode, either when the pad is terminated to VSS via an external resistor as shown in FIG. 4 (alternatively referred to herein as LV ground-terminated mode) or when the pad is not terminated to an external resistor and operates in a LV rail-to-rail mode, as shown in FIG. 5, because signal ModeSel is set to 1, transistors MP3 and MN3 are on.

At power terminated-mode and rail-to-rail HV modes, because signal ModeSel is at zero, signal ModeSelx is set to 1 via inverter 802 thus causing PMOS transistor MPPU1 to be off and NMOS transistor MNB1 to be on. This causes signal LP_BIN to receive the VSH voltage. Inverter 804 which operates between the high and low supply voltages VDDQ and VSH, inverts signal LP_BIN to generate signal LP_BIN_PUP which is at VDDQ. The high voltage of signal LP_BIN_PUP turns off PMOS transistor MP3 of LV PU driver 140. Because signals ModeSel and ModeSelx are at low and high voltage levels respectively, transistors MNTG1 and MPTG1, which form a transmission gate, are off during these two modes.

Signal LP_BIN_PUPB is generated from the pad (identified using reference character 810) signal using transistors MNAT1, MNAT2, MNAT3 and MNAT4 when the transmission gate is off. If the signal at the pad 810 is at VDDQ, then NMOS transistor MNAT1 is on. Furthermore, because signal ModeSelx is also at VDDQ, transistor MNAT2 is also on. Therefore, signal LP_BIN_PUPB receives voltage VSH that is available at the source terminal of transistor MNAT2 via transistors MNAT1 and MNAT2.

During the HV rail-to-rail mode, NMOS transistor MNAT3, which receives voltage VSH at its gate terminal, and NMOS transistor MNAT4, which receives the high voltage of signal ModeSelx at its gate terminal, are on. Consequently, signal LP_BIN_PUPB is pulled to the ground potential if the pad is also at the ground potential. During the HV power-terminated mode, if the pad voltage is at Volpad, transistor MNAT1 and MNAT2 are in a relatively weak conductive states (i.e., are weakly on) thereby causing signal LP_BIN_PUPB to be kept at VSH voltage. By tracking the voltage VSH, signal LP_BIN_PUPB applies the appropriate bias voltage to transistor MN3 of output driver 100, while protecting transistor MN3 from relatively high voltages that can cause stress and degrade the transistor. Furthermore, signal LP_BIN_PUPB turns off transistor MN3 when the pad is at zero volts, thereby preventing current leakage from VDDQ to the pad.

During the ground-terminated and rail-to-rail LV mode of operations, transistors MNAT2, MNAT4 and MNB1 are off, transmission gate transistors MNTG1 and MPTG1 as well as transistor MPPU1 are on. Because signal LP_BIN_PUPB is the inverse of signal LP_BIN_PUP, signals LP_PIN applied to inverter 804 is in phase with signal LP_BIN_PUPB. Furthermore, because signal LP5_Codes is inverted once by inverter 806 and again by transistors MPPU2 and MNPU1, signal LP5_Pcodes is in phase with signals LP_BIN and P_BIN_PUPB. Therefore, if the bit received via signal LP5_Pcodes is a logic high, both transistors MN3 and MP3 of LV output driver 140 are on. Conversely, if the bit received via signal LP5_Pcodes is at a logic low, both transistors MN3 and MP3 of LV output driver 140 are off.

Figure 9:
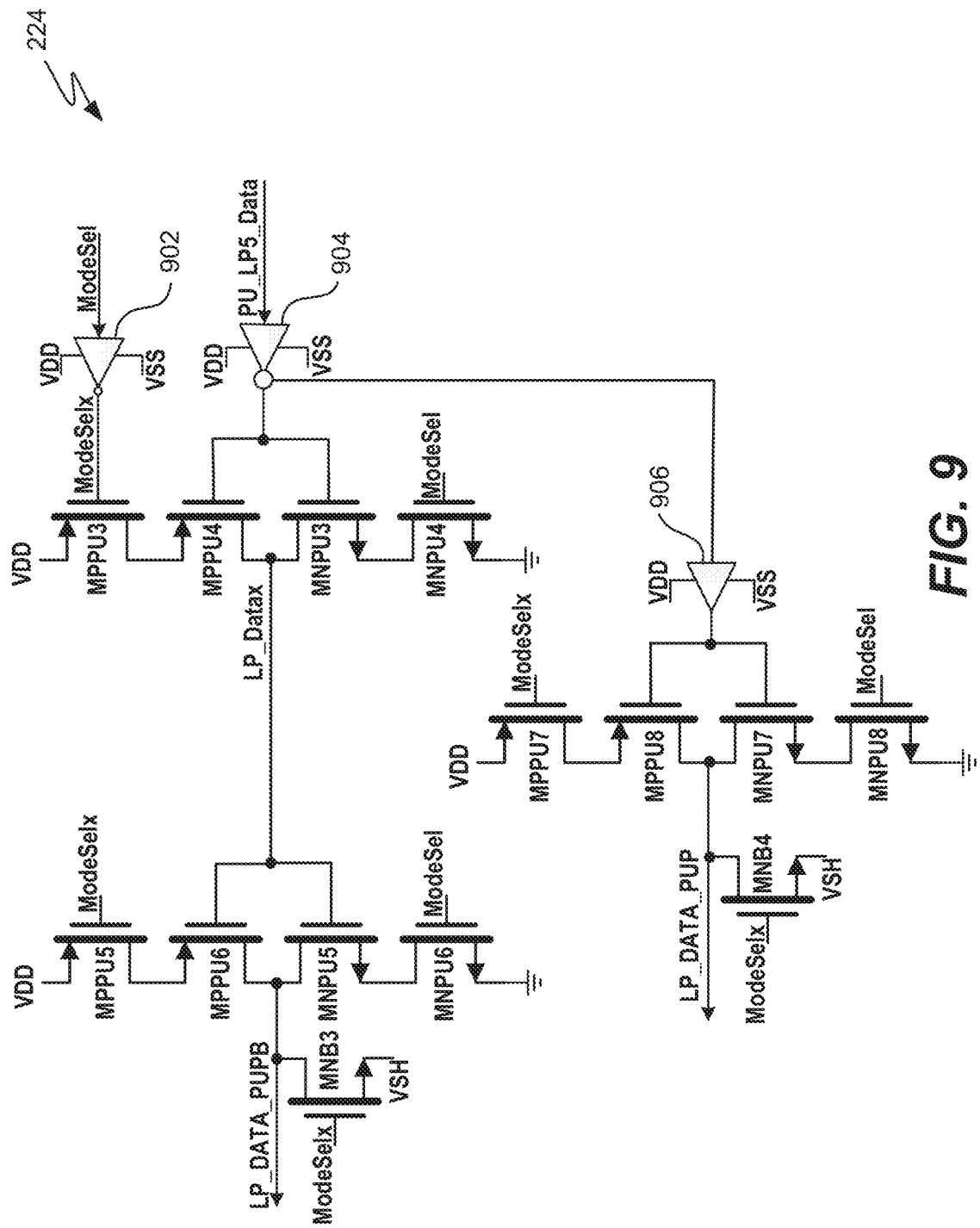
FIG. 9 is a transistor schematic diagrams of a control circuit supplying signals to the output driver shown in FIGS. 1-5, in accordance with one embodiment of the present disclosure.

FIG. 9 is a transistor schematic diagrams of LV PU data block 224 shown in FIGS. 2-5, in accordance with one embodiment of the present disclosure. Referring to FIGS. 2-5 and 9 concurrently, as described above, during the power-terminated and HV rail-to-rail modes of operations, transistors MP2 and MN2 of LV PU driver 140 are off. During the ground-terminated and LV rail-to-rail modes of operations, transistors MP2 and MN2 are on.

During the power-terminated and HV rail-to-rail modes of operation, because signal ModeSelx is at a logic high, PMOS transistor MPPU5 and NMOS transistor MNPU6 are off. Therefore, signal LP_DATA_PUPB receives the voltage VSH via transistor MNB3. For the same reason, transistors MPPU7 and MNPU8 are also off. Therefore, signal LP_DATA_PUP receives the voltage VSH via transistor MNB4. As shown, signal ModeSelx is generated by inverter 902 which receives signal ModeSel as input.

During the ground-terminated and LV rail-to-rail modes, transistors MPPU3, MNPU$, MPPU7, MNPU8, MPPU5 and MNPU6 are on. Signal PU_LP5_Data is inverted by inverter 904, whose output is inverted by the inverter formed by PMOS transistor MPPU4 and MNPU3 to generate signal LP_Datax. Signal LP_Datax is inverted by the inverter formed by PMOS transistors MPPU6 and NMOS transistor MNPU5 to generate signal LP_DATA_PUPB. In other words, signal LP_DATA_PUPB is the inverse of signal PU_LP5_Data. Signal LP_DATA_PUPB is applied to NMOS transistor MN2 of LV PU driver 140 shown in FIG. 2.

The output signal of inverter 904 is buffered by buffer 906, whose output is inverted by the inverter formed by PMOS transistor MPPU8 and NMOS transistor MNPU7 to generate signal LP_DATA_PUP. Signal LP_DATA_PUP is thus in phase with signal PU_LP5_Data. Signal LP_DATA_PUP is applied to PMOS transistor MP2 of LV PU driver 140 shown in FIG. 2.

Figure 10:
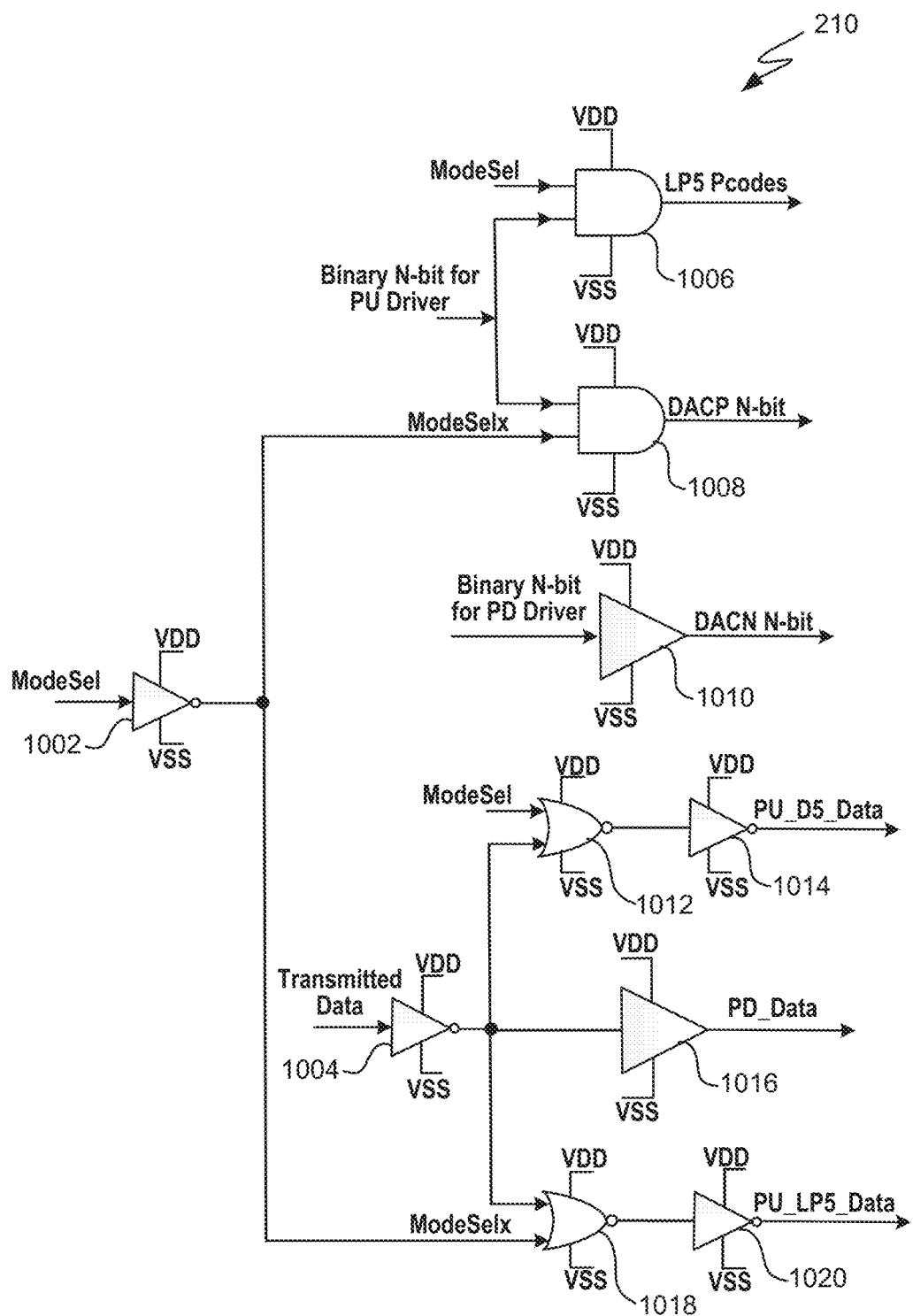
FIG. 10 is a transistor schematic diagrams of a control circuit supplying signals to the output driver shown in FIGS. 1-5, in accordance with one embodiment of the present disclosure.

FIG. 10 is a logic block diagram of data and control logic 210 shown in FIGS. 2-5, in accordance with one embodiment of the present disclosure. During the power-terminated and HV rail-to-rail modes of operation applications, signal ModeSel is set to 0. AND gate 1006 receives the signal ModeSel as well as the N-bit data for the PU driver. Therefore, when signal ModelSel is set to 0, AND gate 1006 set the signal LP5_Codes to 0. AND gate 1008 receives the signal ModeSelx (which is generated by inverter 1002 from signal ModeSel, i.e., signal ModeSelX is the inverse of signal ModeSel) as well as the N-bit code for the PU driver to generate the N-bit code associated with signal DACP. Buffer 1010 receives N-bit code for the PD driver to generate the N-bit code associated with signal DACN.

The data to be transmitted, also referred to herein and shown as transmitted data, is buffered by buffer 1004 whose output is applied to NOR gate 1012. NOR gate 1012 also receives signal ModeSel and delivers its output signal to inverter 1014 which generates the signal PU_D5_Data for high voltage operation mode when ModeSel is 0. Inverter 1016 receives the output of inverter 1004 and generate the signal PD_Data. NOR gate 1018 receives the output of inverter 1004 as well as the signal ModeSelx and delivers its output signal to inverter 1020. Inverter 1020 generates signal PU_Up5_Data at its output for low voltage operation mode when ModeSel is high. During the power up, signal ModeSel is set to zero to provide protection against over voltages, as described above. Once the IC that includes the output driver is booted up, signal ModeSel is set to one or zero depending on the selected mode of operation.

Figure 11:
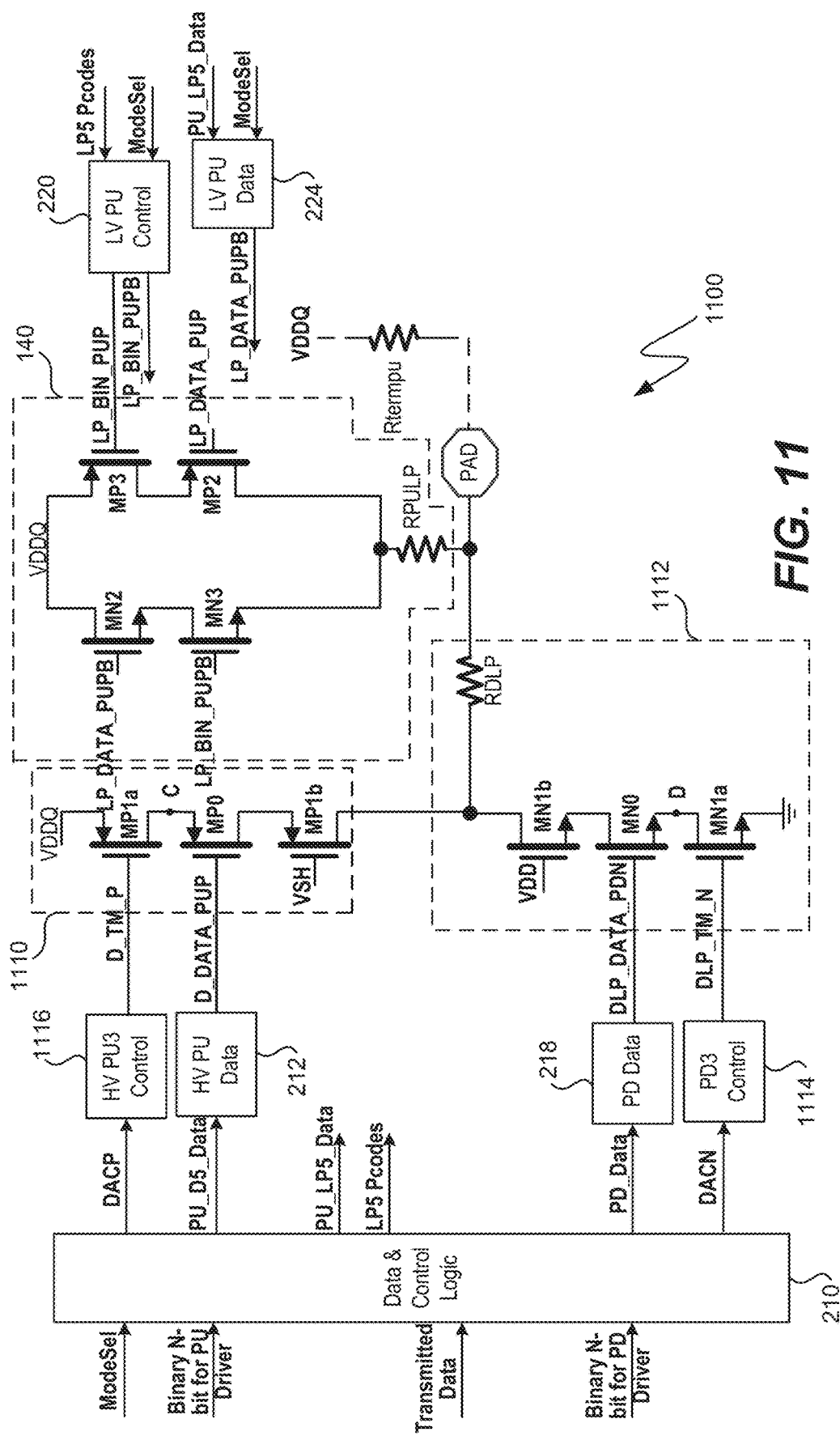
FIG. 11 is a schematic diagram of an output driver, in accordance with another embodiment of the present disclosure.

FIG. 11 is a schematic diagram of an output driver 1100, in accordance with another embodiment of the present disclosure. Output driver 1100 is shown as being in a power-terminated mode where the pad is connected to the supply voltage VDDQ via resistor Rtermpu. Output driver 1100 is also adapted to operate in a HV rail-to-rail mode when the pad is not connected to an external resistor.

Output driver 1100 is shown as including, in part, a HV PU driver 1110, a common PD driver 1112, and a LV PU driver 140, which is disabled in this operation mode. Output driver 1100 is also shown as including, in part, HV PU3 control block 1116, HV PU data block 212, PD Data block 218, PD3 control block 1114, LV PU control block 220, and LV PU Data block 220 that provide the data and control signals to HV PU driver 1110, common PD driver 1112, and LV PU driver 140, as shown. LV PU driver 140 operates in the same manner as described above with reference to FIGS. 1-5.

HV PU driver 1110 is similar to HV PU driver 120 shown in FIG. 2 except that HV PU driver 1110 includes a stack of three PMOS transistors MP1*a*, MP0 and MP1*b*. Transistor MP0 receives data signal D_DATA_PUP, as described above. Transistor MP1b receives signal VSH described above. Transistor MP1a receives signal D_TM_P from HV PU3 control block 1116 in response to the N-bit DAC signal DACP. Although HV PU driver 1110 is shown as including one MP1a transistor, it is understood that HV PU driver 1110 includes ($2^N-1$) MP1a transistors that are coupled in parallel, between VDDQ and node C, each receiving at its gate terminal a different one of ($2^N-1$) bits representative of the N-bit signal DAC signal DACP applied to HV PU3 control block 1116.

PD driver 1112 is similar to PD driver 160 shown in FIG. 2 except that PD driver 1112 includes a stack of three NMOS transistors MN1b, MN0 and MN1b. Transistor MN0 receives data signal DLP_DATA_PDN, as described above. Transistor MN1b receives signal VDD. Transistor MN1a receives signal DLP_TM_N supplied by PD3 control block 1114 in response to the N-bit DAC signal DACN. Although PD driver 1112 is shown as including one MN1a transistor, it is understood that LV PD driver 1112 includes ($2^N-1$) MN1a transistors that are coupled in parallel, between the ground terminal and node D, each receiving at its gate terminal a different one of ($2^N-1$) bits representative of the N-bit signal DAC signal DACN applied to PD2 control block 1114.

Signal D_DATA_PUP is the transmitted data for HV PU driver 1110 and toggles between VDDQ and VSH. The ($2^N-1$) thermometer bits D_TM_P applied to transistors MP1a vary between voltages VSH to VDDQ, and are used to adjust the impedance of HV PU driver 111.

The gate voltage of transistor MN2 of LV PU driver 140 is biased at VSH, and the gate voltage of transistor MN3 of LV PU driver 140 is biased at VSH when the pad voltage is VDDQ, and is further biased at 0 volt when the pad voltage is at 0 volt to enable tracking, as was described above. Signal LP_BIN_PUP is biased at VDDQ to turn off PMOS transistor MP3 of LV PU driver 140. Signal LP_DATA_PUP is biased at VSH to protect transistor MP2 of LV PU driver 140 against excessive voltages. The data and control blocks, namely HV PU3 control 1116, HV PU data 212, PD data 218, PD3 control 1114, LV PU control 220, and LV PU data 224, and data and control logic 210 operate substantially in the same manner as described above with respect to FIGS. 2-5.

Figure 12:
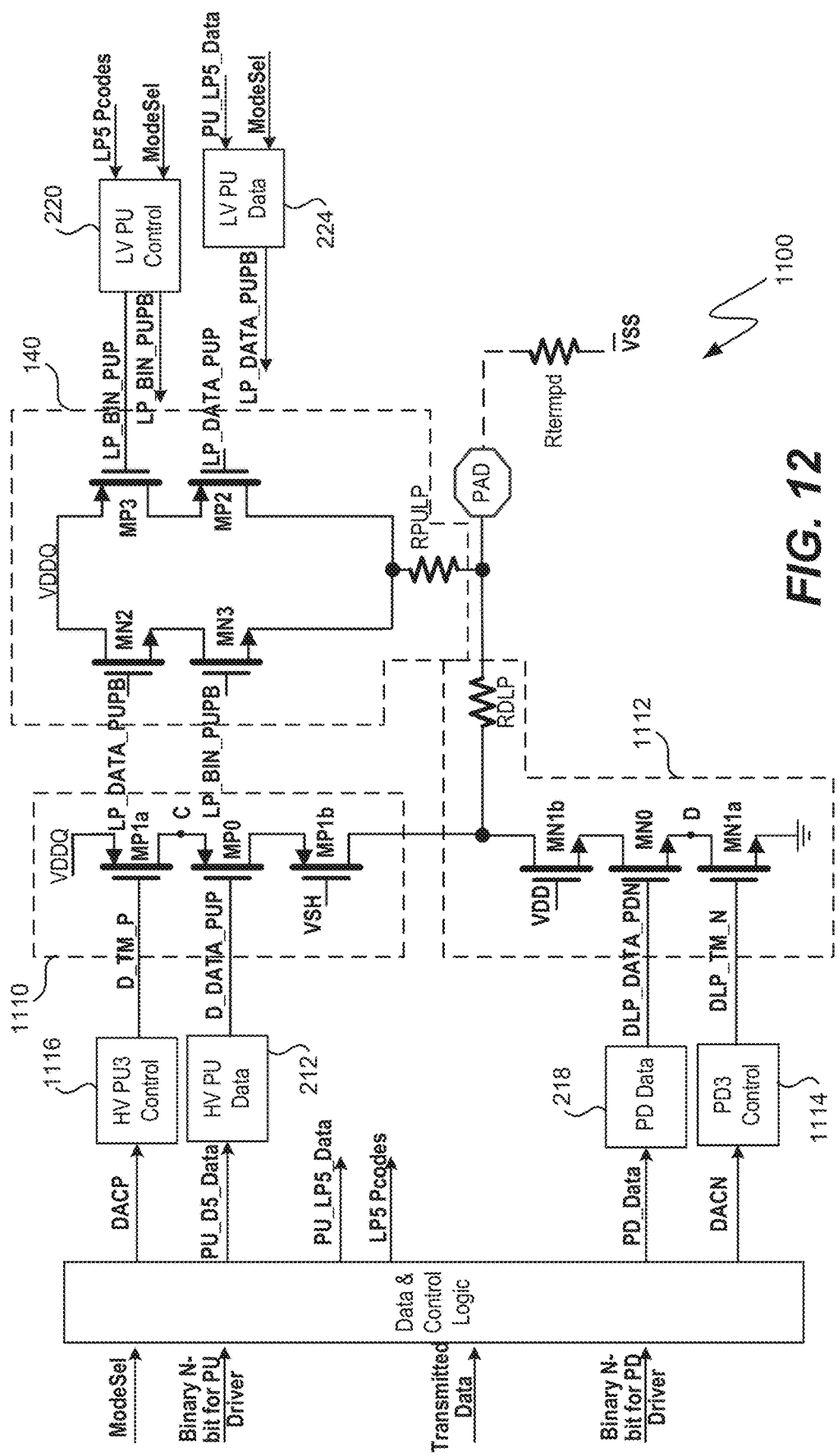
FIG. 12 is a schematic diagram of an output driver, in accordance with another embodiment of the present disclosure.

FIG. 12 is a schematic diagram of an output driver 1100 when selected to operate in a ground-terminated mode where the pad is connected to the VSS via resistor Rtermpd. Output driver 1100 is also adapted to operate in a LV rail-to-rail mode.

During the ground-terminated or LV rail-to-rail modes of operation, voltage VDDQ is smaller than the maximum voltage applied to core memory transistors. Therefore, during these two modes, HV PU driver 1110 is disabled and LV PU 140 driver is enabled by setting mode selected signal ModeSel to VDD, and shorting VSH to ground. During rail-to-rail mode of operation, no external resistor is connected to the pad (not shown).

During the ground-terminated or LV rail-to-rail modes of operation, signal D_DATA_PUP is biased at VDDQ thus turning off MP0 of HV PU driver 1110. The ($2^N-1$) thermometer bits DLP_TM_N applied to transistors MN1a vary between voltages VSS and VDD, and are used to adjust the impedance of PD driver 1112.

Signal DLP_DATA_PDN is the transmitted data for PD driver 1112 and toggles between 0 and VDD. Signals LP_BIN_PUPB and LP_BIN_PUP are complementary output bits of signal LP5_Pcodes and are used to adjust the impedance of the LV PU driver 1112. If signal LP_BIN_P-UPB is set to VDD and signal LP_BIN_PUP is set to 0, both devices MN3 and MP3 are on. Conversely, if signal LP_BIN_PUPB is set to 0 and signal LP_BIN_PUP is set to VDD, both devices MN3 and MP3 are off. Signals LP_DATA_PUPB and LP_DATA_PUP are also complementary output bits of transmitted data PU_LP5_Data. If signal LP_DATA_PUPB is at VDD and signal LP_DATA_PUP is at 0, both devices MN2 and MP2 are on. Conversely, if signal LP_DATA_PUPB is at 0 and signal LP_DATA_PUP is at VDD, both devices MN2 and MP2 are off.

Figure 13:
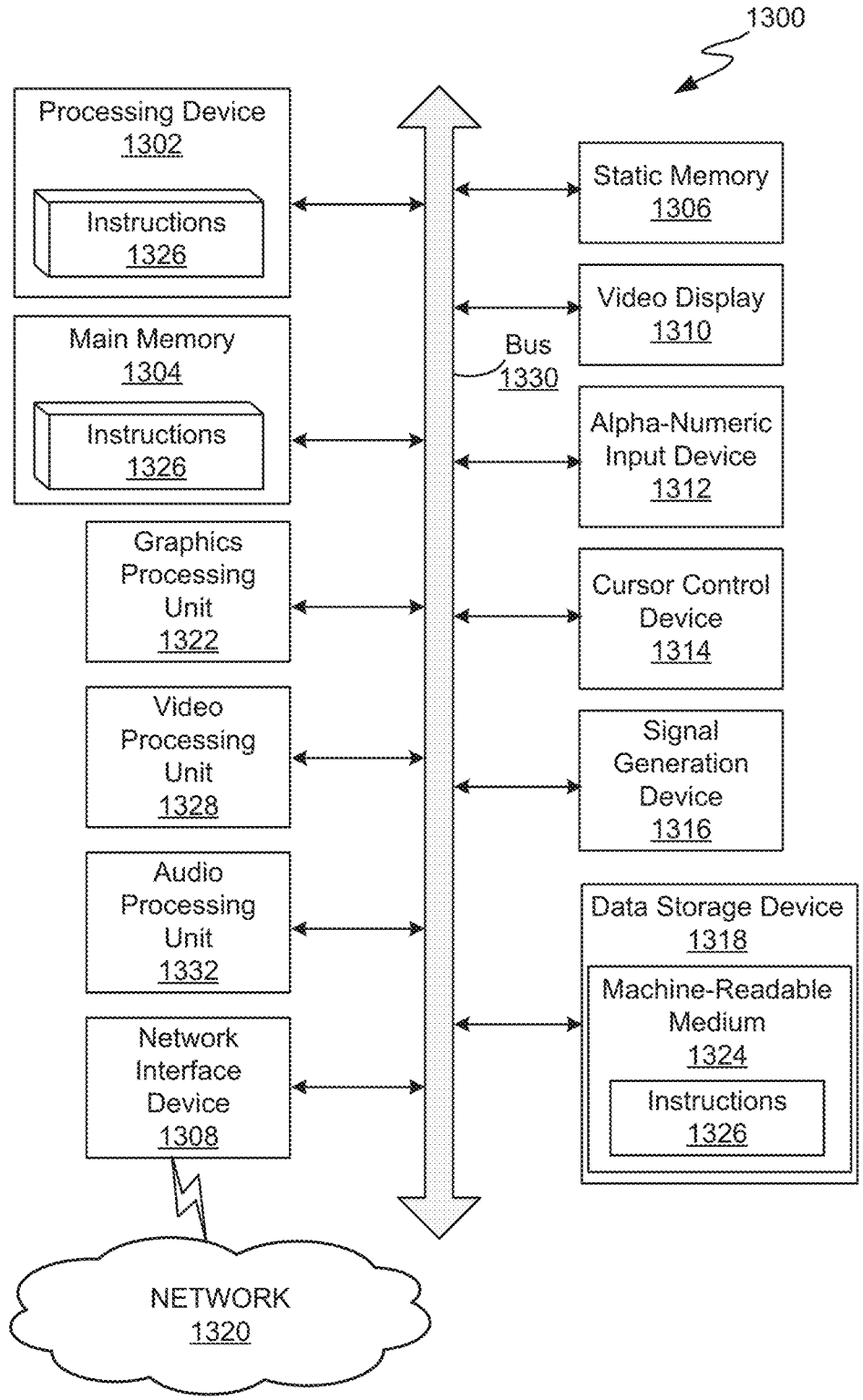
FIG. 13 is a diagram of an example of a computer system in which embodiments of the present disclosure may operate.

FIG. 13 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1300 includes a processing device 1302, a main memory 1304 (e.g., read-only memory (ROM), flash memory, dynamic random access memory (DRAM) such as synchronous DRAM (SDRAM), a static memory 1306 (e.g., flash memory, static random access memory (SRAM), etc.), and a data storage device 1318, which communicate with each other via a bus 1330.

Processing device 1302 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 1302 may be configured to execute instructions 1326 for performing the operations and steps described herein.

The computer system 1300 may further include a network interface device 908 to communicate over the network 1320. The computer system 1300 also may include a video display unit 1310 (e.g., a liquid crystal display (LCD) or a cathode ray tube (CRT)), an alphanumeric input device 1312 (e.g., a keyboard), a cursor control device 1314 (e.g., a mouse), a graphics processing unit 1322, a signal generation device 1316 (e.g., a speaker), graphics processing unit 1322, video processing unit 1328, and audio processing unit 1332.

The data storage device 918 may include a machine-readable storage medium 1324 (also known as a non-transitory computer-readable medium) on which is stored one or more sets of instructions 1326 or software embodying any one or more of the methodologies or functions described herein. The instructions 1326 may also reside, completely or at least partially, within the main memory 1304 and/or within the processing device 1302 during execution thereof by the computer system 1300, the main memory 1304 and the processing device 902 also constituting machine-readable storage media.

In some implementations, the instructions 1326 include instructions to implement functionality corresponding to the present disclosure. While the machine-readable storage medium 1324 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1302 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. An output driver, comprising:
   a first pullup driver comprising:
      a first PMOS transistor having a source terminal coupled to a first supply voltage and a gate terminal receiving a first data; and
      a second PMOS transistor having a source terminal coupled to a drain terminal of the first PMOS transistor and a gate terminal receiving a first analog signal;
   a pulldown driver comprising:
      a first NMOS transistor having a source terminal coupled to a second supply voltage and a gate terminal receiving a second data different than the first data; and
      a second NMOS transistor having a source terminal coupled to a drain terminal of the first NMOS transistor, a drain terminal coupled to a drain terminal of the second PMOS transistor, and a gate terminal receiving a second analog signal; and
   a first resistive element coupled between the drain terminal of the second NMOS transistor and a pad of the output driver.

2. The output driver of claim 1, further comprising:
   a second pullup driver comprising:
      a third NMOS transistor having a drain terminal coupled to the first supply voltage and a gate terminal receiving a third data;
      a fourth NMOS transistor having a drain terminal coupled to a source terminal of the third NMOS transistor and a gate terminal receiving a first control signal;

a third PMOS transistor having a drain terminal coupled to a source terminal of the fourth NMOS transistor and a gate terminal receiving an inverse of the third data; and a fourth PMOS transistor having a source terminal coupled to the first supply voltage and a gate terminal receiving an inverse of the first control signal.

3. The output driver of claim 2, further comprising:
a second resistive element disposed between the pad and the source terminal of the fourth NMOS transistor.

4. The output driver of claim 3, further comprising:
a control circuit configured to cause the pad to be coupled to:
the first supply voltage via a first external resistor in response to a first state of a mode select signal; and
to the second supply voltage via a second external resistor in response to a second state of the mode select signal.

5. The output driver of claim 4 wherein the output driver is disposed in a memory comprising:
a first digital-to-analog converter (DAC) generating the first analog signal; and
a second DAC generating the second analog signal.

6. The output driver of claim 4, further comprising:
a level shifter configured to cause the first data to vary between the first supply voltage and a third voltage, wherein the third voltage is smaller than the first supply voltage and greater than the second supply voltage.

7. The output driver of claim 4, wherein the second supply voltage is a ground voltage.

8. The output driver of claim 6, wherein the output driver is disposed in a memory comprising a core operating using a fourth supply voltage that is smaller than the first supply voltage.

9. The output driver of claim 8, wherein the third voltage is defined by a difference between the first and fourth voltages.

10. The output driver of claim 9, wherein the mode select signal is placed in the first state when the first supply voltage is greater than the fourth supply voltage, and wherein the mode select signal is placed in the second state when the first supply voltage is smaller than the fourth supply voltage.

11. A non-transitory computer readable medium comprising stored instructions, which when executed by a processor, cause the processor to generate data representative of an output driver, the output driver comprising:
a first pullup driver comprising:
a first PMOS transistor having a source terminal coupled to a first supply voltage and a gate terminal receiving a first data; and
a second PMOS transistor having a source terminal coupled to a drain terminal of the first PMOS transistor and a gate terminal receiving a first analog signal;
a pulldown driver comprising:
a first NMOS transistor having a source terminal coupled to a second supply voltage and a gate terminal receiving a second data different than the first data; and
a second NMOS transistor having a source terminal coupled to a drain terminal of the first NMOS transistor, a drain terminal coupled to a drain terminal of the second PMOS transistor, and a gate terminal receiving a second analog signal; and
a first resistive element coupled between the drain terminal of the second NMOS transistor and a pad of the output driver.

12. The non-transitory computer readable medium of claim 11 wherein the output driver comprises a second pullup driver comprising:
a third NMOS transistor having a drain terminal coupled to the first supply voltage and a gate terminal receiving a third data; and
a fourth NMOS transistor having a drain terminal coupled to a source terminal of the third NMOS transistor and a gate terminal receiving a first control signal;
a third PMOS transistor having a drain terminal coupled to a source terminal of the fourth NMOS transistor and a gate terminal receiving an inverse of the third data; and
a fourth PMOS transistor having a source terminal coupled to the first supply voltage and a gate terminal receiving an inverse of the first control signal.

13. The non-transitory computer readable medium of claim 12 wherein the output driver further comprises a second resistive element disposed between the pad and the source terminal of the fourth NMOS transistor.

14. The non-transitory computer readable medium of claim 13 wherein the output driver further comprises:
a control circuit configured to cause the pad to be coupled to:
the first supply voltage via a first external resistor in response to a first state of a mode select signal; and
the second supply voltage via a second external resistor in response to a second state of the mode select signal.

15. The non-transitory computer readable medium of claim 14 wherein the output driver is disposed in a memory comprising:
a first digital-to-analog converter (DAC) generating the first analog signal; and
a second DAC generating the second analog signal.

16. A method of driving an output pad, the method comprising:
pulling up a voltage at the pad via a first pullup driver that comprises:
a first PMOS transistor having a source terminal coupled to a first supply voltage and a gate terminal receiving a first data; and
a second PMOS transistor having a source terminal coupled to a drain terminal of the first PMOS transistor and a gate terminal receiving a first analog signal;
pulling down the voltage at the pad via a pulldown driver that comprises:
a first NMOS transistor having a source terminal coupled to a second supply voltage and a gate terminal receiving a second data different than the first data; and
a second NMOS transistor having a source terminal coupled to a drain terminal of the first NMOS transistor, a drain terminal coupled to a drain terminal of the second PMOS transistor, and a gate terminal receiving a second analog signal; and
adjusting an impedance associated with the pad based on the first analog signal and the second analog signal.

17. The method of claim 16 further comprising:
pulling up the voltage at the pad via a second pullup driver that comprises:
a third NMOS transistor having a drain terminal coupled to the first supply voltage and a gate terminal receiving a third data; and a fourth NMOS transistor having a drain terminal coupled to a source terminal of the third NMOS transistor and a gate terminal receiving a first control signal;

a third PMOS transistor having a drain terminal coupled to a source terminal of the fourth NMOS transistor and a gate terminal receiving an inverse of the third data; and a fourth PMOS transistor having a source terminal coupled to the first supply voltage and a gate terminal receiving an inverse of the first control.

18. The method of claim 17 further comprising:

passing the current from a second resistive element disposed between the pad and the source terminal of the fourth NMOS transistor.

19. The method of claim 18 further comprising:

causing the pad to be coupled to the first supply voltage via a first external resistor in response to a first state of a mode select signal.

20. The method of claim 19 further comprising:

causing the pad to be coupled to the second supply voltage via a second external resistor in response to a second state of the mode select signal.

* * * * *